United States Patent [19]

Brown, Jr. et al.

[11] 4,448,149

[45] May 15, 1984

[54] APPARATUS FOR REMOVABLY MOUNTING AND SUPPLYING MECHANICAL AND ELECTRICAL ENERGY TO A VACUUM CHAMBER SUBSTRATE HOLDER

[75] Inventors: William W. Brown, Jr., Milton; Gerhard P. Dahlke, Fishkill; Francis T. Lupul, LaGrangeville, all of N.Y.

[73] Assignee: International Business Machines Corporation, Armonk, N.Y.

[21] Appl. No.: 433,590

[22] Filed: Oct. 12, 1982

[51] Int. Cl.³ .............................................. C23C 13/08
[52] U.S. Cl. .................................... 118/500; 118/730; 118/723; 118/50.1; 118/729
[58] Field of Search ...................... 118/723, 730, 50.1, 118/725, 500, 728, 729; 156/643, 345

[56] References Cited

U.S. PATENT DOCUMENTS

| | | | |
|---|---|---|---|
| 3,507,248 | 4/1970 | Seeley et al. | 118/48 |
| 3,864,239 | 2/1975 | Fletcher et al. | 204/298 |
| 4,085,022 | 4/1978 | Wechsung | 204/192 E |
| 4,204,936 | 5/1980 | Hartsough | 204/192 R |
| 4,226,208 | 10/1980 | Nishida et al. | 118/730 X |
| 4,269,137 | 5/1981 | Johnson | 118/50.1 |
| 4,290,875 | 9/1981 | Duckworth | 204/298 |

OTHER PUBLICATIONS

Bauer, "Obtaining an Oxide-Free Interface in VIA Connections", IBM Tech. Disclosure Bulletin, vol. 20, No. 2, Jul. 1977, pp. 574–576.
Cole, "Planetary Sensing Unit for Thin Film Deposition", IBM Tech. Disclosure Bulletin, vol. 16, No. 7, Dec. 1973, pp. 2242–2243.
Mock et al., "Drive Mechanism for Rotating Dome in a Metal Evaporator", IBM Tech. Disclosure Bulletin, vol. 14, No. 8, Jan. 1972, pp. 2382–2383.
Brainard et al., "RF Sputter-Etching and In-situ Evaporation of Metals", 1976, vol. 19, No. 7, pp. 2523–2524

*Primary Examiner*—John D. Smith
*Assistant Examiner*—Bernard F. Plantz
*Attorney, Agent, or Firm*—Wolmar J. Stoffel

[57] ABSTRACT

Briefly, the apparatus in accordance with this invention features an energy coaxial feedthrough fix-mounted in the wall of the vacuum chamber for supplying electrical and mechanical energy from sources located externally of the vacuum chamber to within the vacuum chamber. Additionally, the apparatus includes a movable coaxial coupler capable of releasably engaging the coaxial feedthrough and additionally releasably latching a substrate holder. Finally, the apparatus includes a linkage assembly located within the chamber connected to the coupler so that the coupler may be located in a first position proximate an access port in the chamber wall to facilitate quick and convenient loading of a substrate holder and a second position in which the coupler may be connected to the feedthrough for uniformly transmitting electrical and mechanical energy to the substrate holder and the substrates thereon.

11 Claims, 8 Drawing Figures

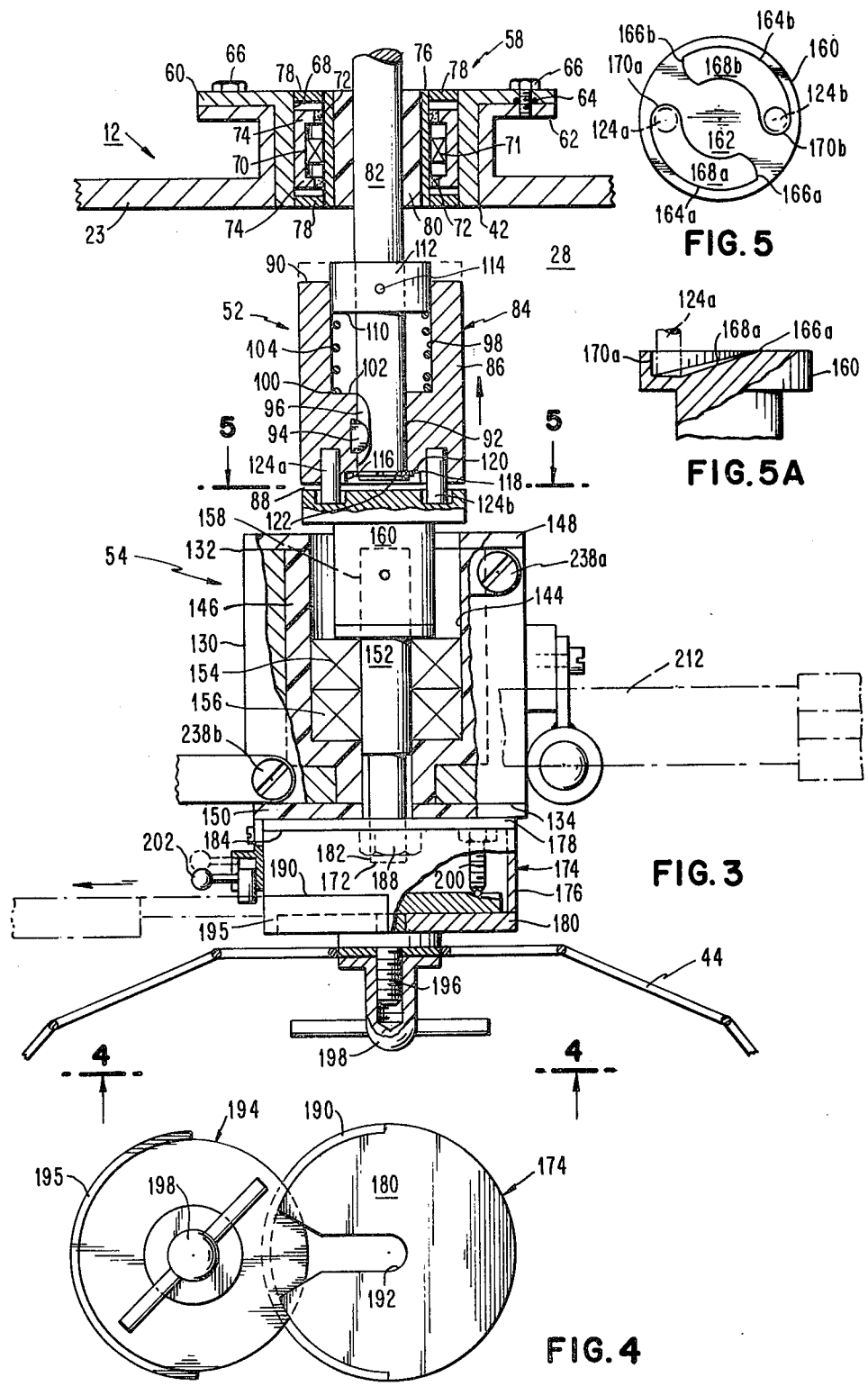

APPARATUS FOR REMOVABLY MOUNTING AND SUPPLYING MECHANICAL AND ELECTRICAL ENERGY TO A VACUUM CHAMBER SUBSTRATE HOLDER

FIELD OF INVENTION

This invention concerns apparatus for feeding electrical and mechanical energy into a vacuum chamber. More particularly, the invention concerns apparatus for removably mounting a substrate holder within a vacuum chamber and for supplying to the holder during substrate processing r.f. and d.c. electrical energy and rotational mechanical energy from sources located externally of the chamber.

BACKGROUND OF THE INVENTION

To keep the cost of making integrated circuits low, manufacturers have sought processing equipment such as vacuum systems capable of handling high product volume in minimal time i.e. high thruput. The ability, however, to realize minimal process time and high process volume is problematical.

The making of integrated circuits used in electronic equipment today requires elaborate and complicated manufacturing procedures. These procedures make high thruput difficult to realize. The electronic devices included in integrated circuits are typically made by controllably introducing impurities into a silicon substrate. The impurities are positioned in the substrate to defining regions of varying conductivity type necessitated for device operation. Following formation of the impurity regions, the devices are provided with electrical leads and interconnected to form circuits by depositing one or more metallization layers at the substrate surface.

To assure purity and adherence of the metallization and to prevent contamination of the substrate surface, manufacturers are compelled to apply the interconnect metallization while the substrates are under vacuum, i.e. in a vacuum system. In the system chamber, vacuum etching and cleaning steps are performed to expose and prepare the substrate surface for receiving the metal to be deposited. Often such steps require r.f. and d.c. electrical energy as, for example, where reactive ion etching or sputter etching processes are used. Since the sources of electrical energy are typically located externally of the vacuum chamber for simplicity and economy of chamber space, it is necessary to feed the electrical energy into the chamber while maintaining the chamber vacuum. The supply of r.f. energy in these cases can be difficult especially where high thruput is sought.

Additionally, manufacturers have found it necessary to supply mechanical energy to the vacuum system chamber. To assure uniformity of processing, it has been found desirable to move the substrates through the chamber during processing. Typically, this is done by rotating the holder which carries the substrates. By rotating the substrate holder, process nonuniformity in time and space is distributed over the substrates to render them more uniform. As in the case of electrical energy supply, because the source of rotational energy is for simplicity and economy of chamber space located externally of the chamber, it becomes necessary to feed the rotational energy into the chamber while maintaining the chamber vacuum. Like the supply of electrical energy, the supply of mechanical energy can be difficult especially where high thruput is sought.

Because of these energy supply requirements, it is difficult to obtain high thruput. To get high thruput, manufacturers use larger volume vacuum chambers into which they load high capacity holders for carrying larger number of substrates. Uses of high capacity holders, however, in combination with conventional fixed mount electrical and mechanical feedthrough increases process time. As the holder capacity gets larger it becomes more time consuming to load it to a conventional feedthrough. In the case of large capacity holders, the holder with substrates can weigh upwards of 40 pounds and extend to over 30" in diameter. Because stationary feedthroughs are typically located centrally of and proximate to the vacuum chamber dome to enable proper positioning of the substrates during processing, it becomes difficult for operators to quickly position and attach the substrate holders to the feedthrough. The additional time required diminishes thruput.

While apparatus for more conveniently mounting substrate holders and supplying required electrical and mechanical energy have been proposed, as for example commercially available trolley type mount feedthroughs, their designs have not been intended to include r.f. and d.c. electrical capability as well as the rotational mechanical capability. Additionally, these feedthroughs typically suffer from inconsistent and non-uniform supply of rotational motion and electrical energy.

SUMMARY OF THE INVENTION

It is therefore an objective of this invention to provide apparatus for quickly mounting and coupling mechanical and electrical energy to a vacuum chamber substrate holder.

It is a further objective of this invention to provide apparatus capable of supplying r.f. and d.c. electrical energy as well as rotational mechanical energy from sources located external of the vacuum chamber to a substrate holder removably mounted within the chamber.

It is a still further objective of this invention to supply apparatus capable of providing uniform rotational motion to the substrate holder while simultaneously providing continuous and uniform r.f. or d.c. electrical energy to the removably mounted substrate holder.

Briefly, the apparatus in accordance with this invention features a coaxial energy feedthrough fix-mounted in the wall of the vacuum chamber for supplying electrical and mechanical energy from sources located externally of the vacuum chamber to within the vacuum chamber. Additionally, the apparatus includes a movable coaxial coupler capable of releasably engaging the coaxial feedthrough and additionally releasably latching a substrate holder. Finally, the apparatus includes a linkage assembly located within the chamber connected to the coupler so that the coupler may be located in a first position proximate an access port in the chamber wall to facilitate quick and convenient loading of a substrate holder and a second position in which the coupler may be connected to the feedthrough for uniformly transmitting electrical and mechanical energy to the substrate holder and the substrates thereon.

In preferred form, the feedthrough is sealably mounted through the vacuum chamber wall and is arranged to supply r.f. and d.c. electrical energy as well as rotational mechanical energy to the coupler. The feedthrough in preferred form includes a drive shaft mounted through the chamber wall by means of a rotary vacuum seal for transmitting rotational energy into the chamber. Additionally, the drive shaft is arranged to be electrically isolated from the chamber wall to also function as an electrode for conducting electrical energy from outside the chamber to inside the chamber. More particularly, in preferred form, the seal is of the ferrometric type.

Still further, in preferred form, the coupler includes a housing having a centrally located rotationally-mounted drive shaft which is insulated from the coupler housing for coupling the mechanical and electrical energy from the feedthrough to the substrate holder.

Also in preferred form, the apparatus linkage assembly includes a housing fix-mounted to the chamber wall and linkage elements rotationally mounted to the linkage housing and to the coupler so that the coupler may be transported from a first position proximate a chamber access port, at which the substrate holder may be conveniently loaded to the coupler, to a second position at which the coupler may be connected to the feedthrough for receiving electrical and mechanical energy. Still further, in preferred form, the feedthrough and coupler include mating connectors capable of joining the feedthrough and coupler mechanically and electrically within one rotation of the feedthrough drive shaft, electrode. Resiliently mounted drive lugs are provided at the feedthrough drive shaft, electrode connector for cooperation with ramped engagements provided in the coupler connector. With this arrangement, engagement and alignment of the feedthrough and coupler are assured within one revolution of the feedthrough drive shaft, electrode.

FIGURES

The above and other features and advantages of this invention will be better understood from a reading of the following detailed description considered in conjunction with the drawings in which:

FIG. 3 is a side section view of the feedthrough, the coupler and the substrate holder in accordance with this invention;

FIG. 4 is a section view of the apparatus of FIG. 3 taken along lines 4—4 showing the holder latch in accordance with this invention;

FIG. 5 is a section view of the apparatus shown in FIG. 3 taken along lines 5—5 showing the coupler drive shaft connector in accordance with this invention;

FIG. 5a is a side partial section view of the coupler drive shaft, electrode connector in accordance with this invention;

DETAILED DESCRIPTION

Figure 1:
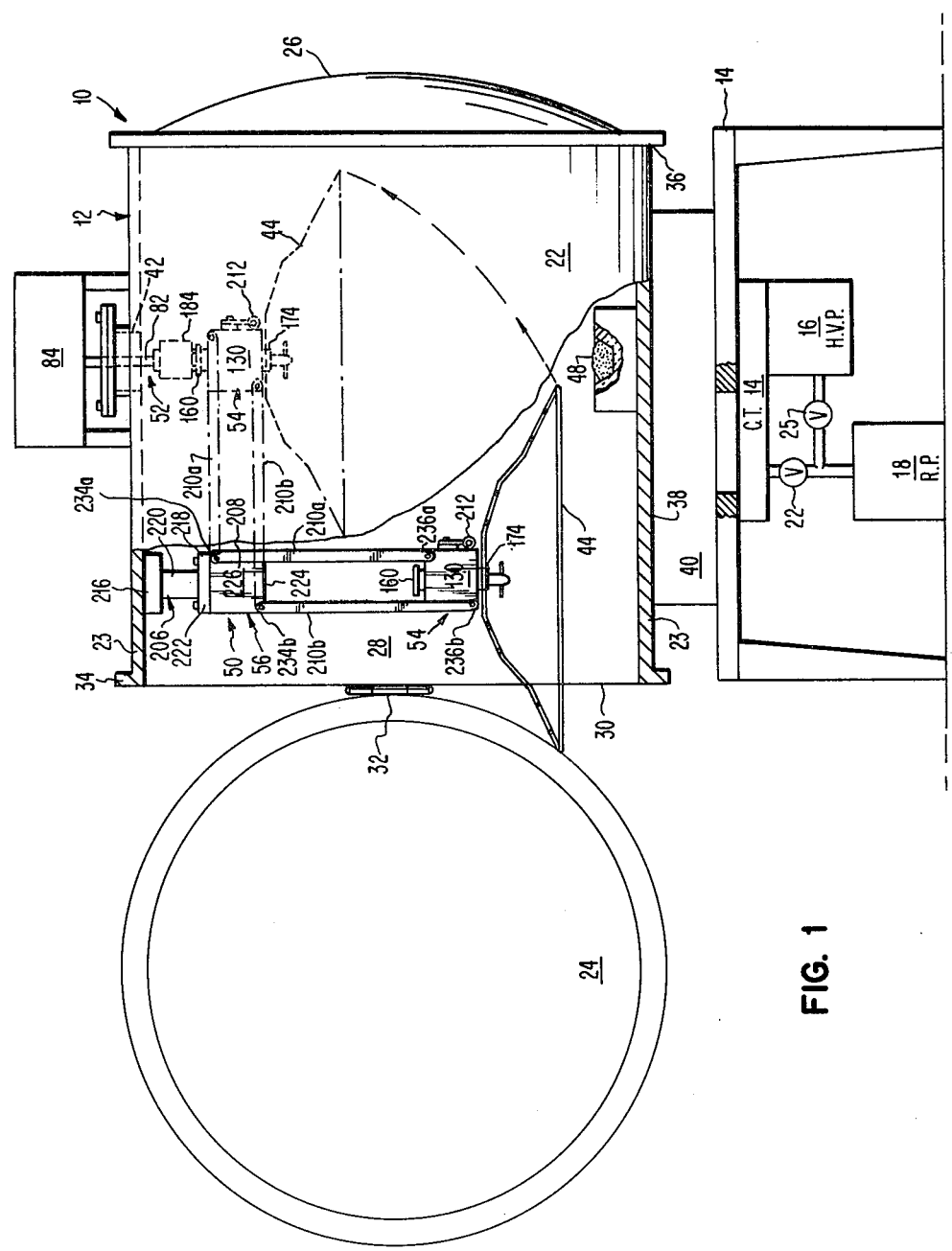
FIG. 1 is a side view of a vacuum system including the apparatus for removably mounting and supplying electrical and mechanical energy to a substrate holder in accordance with this invention.

FIG. 1 shows a vacuum system capable of processing high volumes of integrated circuit substrates which includes the apparatus of this invention. As shown, vacuum system 10 features a large volume horizontal bell jar 12 supported on a stand 14. As in any conventional vacuum unit used for processing integrated circuits, system 10 includes a roughing pump 18, high vacuum pump 16 and cold trap 14 connected by means of valves 22 and 25 for establishing a vacuum in jar 12. The pump units and their connections are of conventional type well known in the art for supporting the vacuum processes conventionally carried out in such systems.

Continuing with reference to FIG. 1, bell jar 12 is seen to include a housing 22 to which closures 24 and 26 are attached to define a vacuum chamber 28. In preferred form, housing 22 is a cylindrical section defined by chamber wall 23. As seen in FIG. 1, housing 22 has a first open end 30 at which closure 24 in the form of an access door is provided. Door closure 24 is mounted to housing 22 by hinge 32 and engages housing 22 in sealing relationship at housing flange 34. A conventional lock assembly (not shown) is used to hold door 24 to housing 24. Housing open end 30 is provided to facilitate convenient and full access to the interior of chamber 28 and thereby establishes an access port for the chamber.

Housing 22 has a second open end 36 at which closure 26 is arranged in fixed relation. Fixed closure 26 is joined to housing 22 in sealing relationship in any convenient manner or, for example, by gasket and bolts.

Continuing with reference to FIG. 1, housing 22 also includes a pump port 38 and pump conduit 40 located at the lower side of housing 22 extending through chamber wall 23. Port 38 and conduit 40 act to couple jar 12 to vacuum pump apparatus above described, e.g. cold trap 14, roughing pump 18, and high vacuum pump 16. As seen in FIG. 1, chamber housing 22 additionally includes a power feedthrough port 42 located at the upper side and centrally of housing 22 which extends through chamber wall 23. Power port 42 permit the supply of electrical and mechanical energy to chamber 28 for integrated circuits processing.

Figure 2:
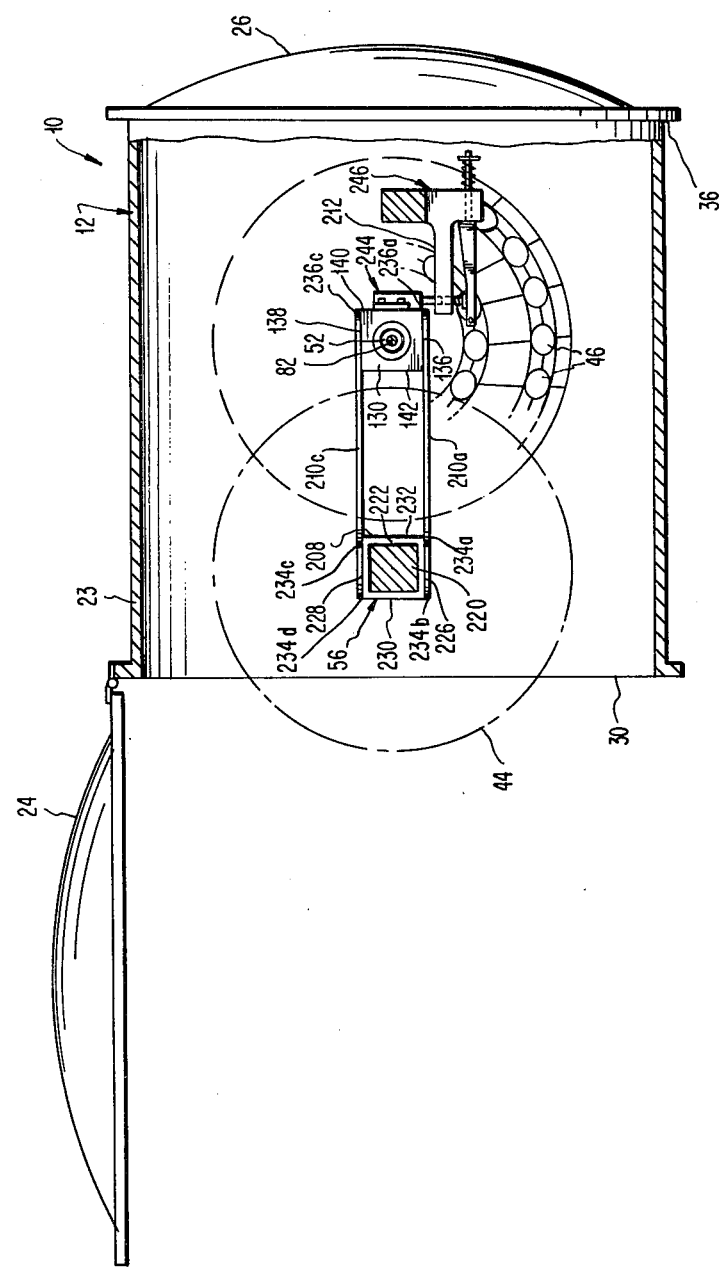
FIG. 2 is a top section view of the vacuum system shown in FIG. 1 taken along lines 2—2 showing the apparatus for removably mounting and supplying electrical and mechanical energy to a substrate holder in accordance with this invention.

As also shown in FIG. 1, vacuum system 10 further includes a holder 44 for retaining integrated circuit substrates. As seen in FIGS. 1 and 2, holder 44 is in the form of a multitiered dome having a plurality of mounting holes 46 for receiving and retaining the substrate and companion mask combinations conventionally used in integrated circuit metallization processing. Holder 44 is located within chamber 28 such that during processing, the substrates will be positioned above a source 48 of metal to be deposited. Also in preferred form and as shown, holder 44 is mounted such that its center line coincides with the metal source center line. With such alignment, when the source is volatilized, the metal may uniformly deposit over the multiple substrates retained on holder 44.

Continuing with reference to FIG. 1, in accordance with this invention, vacuum system 10 is provided with apparatus 50 for removably mounting substrate holder 44 and for supplying r.f. and d.c. electrical energy as well as rotational mechanical energy to it. As shown, mounting and energizing apparatus 50 includes an energy feedthrough 52 mounted at power port 42 for supplying energy internally of chamber 28.

In addition to feedthrough 52, mounting and energizing apparatus 50 also includes a couple 54 capable of releasably energizing feedthrough 52 and additionally releasably latching substrate holder 44. Coupler 54 is provided to facilitate an integrated transfer of mechanical and electrical energy from feedthrough 52 to substrate holder 44.

Finally, apparatus 50 includes a linkage assembly 56 for movably mounting coupler 54 such that it may be located in a first position adjacent the chamber access port 30 and in a second position connected to feedthrough 52. In the first position, coupler 54 is located adjacent access port 30 so that holder 44 may be conveniently loaded into the vacuum chamber 28. In the second position coupler 54 is connected to feedthrough 52 so that the rotational and electrical energy required for processing may be coupled to substrate holder 44 and its associated substrates.

As explained in connection with the background of the invention, in order to carry out the complex processing associated with integrated circuit manufacture, it is often necessary to supply electrical energy to the integrated circuit substrate. Particularly, in those process steps where it is found desirable to clean the substrate surface prior to metallization it may be necessary to supply r.f. or d.c. electrical energy. For example, it has become popular to assure just before deposition that the substrate surface is properly prepared by means of a sputter etch process. In the course of the sputter etch, a plasma is established within the vacuum chamber by supplying either r.f. or d.c. energy to a suitable gas introduced into the chamber. By the application of the r.f. or d.c. energy, the gas is ionized and the resulting ions are free to physically abraid the substrate surface. This action renders the substrate surface clean and better suited to receive the metal to be deposited. Additionally, and as also noted above, in order to assure uniformity of processing within the chamber, it has been found desirable to rotate the substrate holder within the chamber. It has been shown that rotation of the holder within the chamber distributes nonuniformities in space and time during processing rendering the substrates more uniform. Accordingly, it has been found desirable to rotate the substrate holder in addition to supplying r.f. and/or d.c. energy to it.

Still further, and again as noted above, in order to accommodate large numbers of substrates for processing, manufacturers have attempted to increase the size of the chamber volume and the substrate holders to permit simultaneous processing of as many substrates as possible. This has the affect of increasing equipment thruput. In this regard, vacuum systems having a horizontal bell jar have been preferred in oder to eliminate large and expensive mechanisms which would be required for lifting increased volume vertical jars. Unfortunately, however, as the chamber volumes of horizontal bell jar systems and their wafer holders increase in size, it becomes awkward and time consuming to load the holders to fixed position electrical and mechanical feedthroughs. Particularly, it has been found awkward to lift the substrate holder which may weigh as much as 40 pounds when loaded within the chamber and couple it to conventional fixed power feedthrough located centrally of the chamber and proximate to the chamber's upper extent.

While removable, trolley-type mount feedthroughs for the larger substrate holders have been proposed, this apparatus has not been well suited for supply of r.f. energy. A trolley-type mount feedthrough characteristically includes a trolley body mounted on electrically insulated wheels which run in rails suspended from the chamber ceiling extending from the access port to separate electrical and mechanical power sources. In operation, the substrate holder is coupled to the trolley body at the access port and shuttled with the trolley body into the chamber where separate electrical and mechanical power connections are made. As noted, such apparatus employs separate electrical and mechanical connectors for coupling energy to the trolley from which the substrate holder is suspended. The multiple connections require individual alignment and are thus awkward to make, usually resulting in intermittent or open electrical connection. Additionally, the design, as noted, calls for electrically insulating the trolley from the chamber by using insulated trolley wheels. As a result, the trolley body to which the substrate holder is attached is left as an exposed electrode. This results in the trolley body sputtering the metal of which it is made into the chamber causing contamination. Still further, the design suffers from a discontinuous mechanical coupling that causes the rotational motion to be spastic and requires the heavy holder be lifted above shoulder height to be loaded.

The apparatus in accordance with this invention solves the problems previously known in the art by providing an integrated coaxial mounting and energizing apparatus which requires only a single alignment for both electrical and mechanical connection. Additionally, the apparatus permits simple and convenient mount of the holder, thus easing the burden placed on the operator. Still further, this apparatus reduces the amount of mount material which is electrically active by insulating the electrodes. This reduces undesired mount apparatus sputtering. As noted above, the apparatus includes a feedthrough 52, a coupler 54, and linkage system 56 for removably mounting substrate holder 44 within chamber 28.

The apparatus feedthrough 52 is shown in greater detail in FIG. 3. As seen there, feedthrough 52 includes a rotary vacuum seal 58, a combination rotary drive shaft, electrode 82, coaxially mounted in seal 58, and a connector 84 at the end of shaft, electrode 82 for engaging coupler 52. More particularly, feedthrough 52 includes a rotary vacuum seal assembly 58 for mounting the feedthrough to bell jar 12. In preferred form, assembly 58 includes a flanged housing 60 which fits within bell jar power port 42 and is fixed to port flange 62 in vacuum sealing relation. The seal may be affected in any convenient manner as, for example, by means of a gasket 64 and bolts 66 as shown.

Seal assembly 58 additionally includes a rotary seal element 68 mounted coaxially within housing 58. In preferred form, seal element 68 is of the ferrometric type having a stationary permanent magnet 70 fixably mounted coaxially within housing 60 for maintaining ferrofluid 72 between magnet pole faces 74 and a rotary sleeve 76 located coaxially of housing 60 and magnet 70. The ferrofluid 72 and pole faces 74 establish a liquid barrier to vacuum while permitting rotation of sleeve 76. Additionally, seals 78 are provided at the axial ends of housing 60 to maintain static vacuum protection when sleeve 76 is not rotating. A ball bearing 71 is provided for rotational mount of sleeve 76.

Ferrometric seals of the type described are commercially available from the Ferrofluidics Corporation under the trade name Ferrofluidic ™ Seals and their particular structure form no part of this invention.

Continuing, in addition to housing 60 and vacuum seal element 68, assembly 58 also includes an electrically insulating member 80 coaxially press fit within sleeve 76 so that member 80 will rotate with sleeve 76. As shown, insulating member 80 extends the length of sleeve 76 and forms a barrier against electrical r.f. and d.c. energy flow to bell jar wall 23. Member 80 may be made of any conventional insulating material compatible with a vacuum environment (i.e. a low vapor pressure) as, for example, a polyoxymethylene thermoplastic polymer commercially available from the Dupont de Nemours E&I Co. under the trade name Delrin ™.

Continuing with reference to FIG. 3, in addition to seal assembly 58, feedthrough 52 includes a combination drive shaft, electrode 82 for transmitting both r.f. and d.c. electrical energy as well as rotational mechanical energy from sources located externally of the chamber to within the chamber. As shown, feedthrough shaft, electrode 82 is located coaxially of insulating member 80 and is press fit to member 80 so that it will rotate therewith and with seal element sleeve 76.

As better seen in FIG. 1, shaft electrode 82 extends through seal assembly 58 externally of chamber 28 where it is coupled with conventional electrical and mechanical energy supplies shown diagramatically as box 84. Box 84 would include means for rotating shaft 82 as, for example, a motor and gear train conventionally known in the art and additionally r.f. and d.c. electrical supplies coupled to drive shaft 82 by means of a matchbox also well known in the art for matching the r.f. impedance of the shaft, electrode and elements connected thereto to the r.f. supply.

Returning to FIG. 3, feedthrough shaft, electrode 82, extends into chamber 28. At its chamber end, shaft, electrode 82 is provided with an electrical and mechanical connector 84. Connector 84 includes a body 86 which is preferred form is generally cylindrical having a lower face 88 and an upper face 90. As shown, body 86 is mounted on shaft, electrode 82 and is arranged for radial movement with it and axial movement over it. More particularly, and as seen in FIG. 3, body 86 is provided with a bore 92 located radially centrally of and extending axially in body 86 to receive shaft, electrode 82. A drive key 94 is located in bore 92 for mating with a companion key slot 96 which extends axially in shaft, electrode 82. The diameter of bore 92 and the width of slot 96 are respectively dimensioned relative to the diameter of shaft, electrode 82 and the width of key 94 such that body 86 is free to move axially over shaft, electrode 82. While key 94 is arranged to permit axial movement of body 86, it prevents rotation of body 86 relative to shaft, electrode 82. As a result, rotational movement of shaft, electrode 82 is transmitted to body 86.

Continuing with reference to FIG. 3, body 86 is mounted such that its location on shaft electrode 82 is resiliently set, i.e. spring loaded. Thus, if body 86 is displaced from its rest position, forces are established which return it to the rest position. To facilitate this mounting, body 86 is provided with a second bore 98 located coaxially of bore 92 and extending axially from upper body face 90 to a point 100 within body 86. The diameter of bore 98 is dimensioned to be larger than that of bore 92 so as to form an internal shoulder 102 at point 100. Within bore 98, a resilient member is provided which, in preferred form, is a spring 104 as shown in FIG. 3. Spring 104 is positioned in bore 98 such that one spring end abuts body shoulder 102 and the other spring end abuts face 110 of a stop 112 fix mounted on shaft, electrode 82. Stop 112 may be fixed on shaft, electrode 82 in any convenient manner as, for example, by pin 114 as shown. As seen in FIG. 3, the outer diameter of stop 112 is dimensioned to be slidably received within bore 98 to assure freedom of body 86's axial movement.

A further bore 116 is provided in body 86 extending axially from body lower face 88 to a point 118 within body 86. The diameter of bore 118 is dimensioned larger than that of bore 92 such that a shoulder 120 is formed at point 118. A clip ring 122 is provided in an annular groove 123 on shaft, electrode 82 to act as a position stop to shoulder 120 and body 86. By selecting a length for spring 104 greater than the distance between body shoulder 102 and stop face 110, spring 104 is required to be compressed when body 86 is mounted on shaft, electrode 82. The consequence of this mounting is that the spring restoring force urges body shoulder 120 against ring clip 120 to resiliently retain body 86 in the rest position.

With this arrangement, while body 86 is free to be displaced axially along shaft, electrode 82 in the direction of seal assembly 58, restoring forces will be created within spring 104 to return body 86 in its rest position as defined by clip ring stop 122. The extent of permissible displacement of body 82 toward seal assembly 58 is determined by the compression length of spring 104.

Continuing with reference to FIG. 3, feedthrough body 86 is seen to further include an electrical contact and mechanical drive means in the form of lugs 124 located at body lower face 88. In preferred form, two lugs 124a, b are provided mounted perpendicularly in face 88. The center of lugs 124a, b are arranged to be located radially displaced from the center of body 86 and angularly displaced from each other. In preferred form, the lug centers are located radially approximately one quarter the diameter of body 86 and angularly displaced from one another by 180°. Additionally, the lug diameter is selected to fit within the outside diameter of bore 116 and the outside diameter of body 86.

As also seen in FIG. 3, lugs 124a, b extend from body face 88 toward coupler 54 as will be further described below. Lugs 124a, b may be mounted in body 86 in any convenient manner as, for example, by press fit.

In preferred form, the elements of feedthrough connector 84 and feedthrough drive shaft, electrode 82 are made of non-magnetic 300 series stainless steel and are electropolished to a mirror finish so as to limit points of high electric field intensity from arising on their surfaces when r.f. power is applied. This procedure has been found effective in assuring acceptability of the substrates processed.

Continuing with reference to FIG. 3, mounting and energizing apparatus 50 is seen to also include a coupler 54. As shown, coupler 54 includes a housing 130, a combination rotary drive shaft, electrode 152 coaxially mounted in and electrically insulated from housing 130, a shaft, electrode connector 160 for engaging the feedthrough connector 84 and a latch 174 for aligning and releasably engaging substrate holder 44.

More particularly, coupler 54 includes a housing 130 which in preferred form is generally shaped as a cube having an upper face 132 and a lower face 134. Additionally, and as best seen in FIG. 2, housing 130 has a front face 136, a rear face 138, an inside face 140 and an outside face 142.

With reference to FIG. 3, coupler housing 130 is seen to include an internal bore 144 located centrally of housing 130's length (face 136 to 138) and width (face 142 to 140) and extending in housing 130. Within bore 144, an insulating member 146 is provided which extends in the direction of housing 130's height from face 134 to 132. Additionally, housing 130 includes insulating members in the form of plates 148, 150 located respectively at housing upper face 132 and lower face 134. Members 146, 148 and 150 are made of any convenient insulating material compatible with a vacuum environment (low vapor pressure) such as a polyoxymethylene thermoplastic polymetric material, for example, Delrin TM, commercially available from the Dupont de Nemours E&I company. Member 146 may be mounted in bore 144 in any convenient manner as, for example, press fit. Member 148, 150 may for convenience be mounted to body 130 with insulating screws.

With reference to FIG. 3, coupler 54 is seen to also include a combination drive shaft and r.f., d.c. electrode 152. Coupler drive shaft, electrode 152 is provided to receive the rotational and electrical energy from feedthrough drive shaft 82 and transmit it to holder 44. Shaft, electrode 152 is located centrally in housing 130 coaxially and rotationally mounted within insulating member 146. Shaft, electrode 152 extends at least from housing lower face 134 to approximately upper face 132. Shaft, electrode 152 is rotationally mounted in insulating member 146 in any convenient manner as, for example, by means of ball bearings 154, 156 as shown.

At its upper end 158, shaft, electrode 152 is provided with a connector 160 for releasably engaging the feedthrough connector 84 and the drive lugs thereof 124a, b. As best seen in FIG. 4, connector 160 has an upper face 162 which includes ramped engagements 164a, b for mating with the drive lugs 124a, b, respectively. As shown, engagements 164a, b are located in connector face 162 radially displaced from the connector center and angularly displaced from each other. The engagements each include an entry end 166a, b which ramps down from face 162 into connector 160 over cam surfaces 168a, b to drive faces 170a, b. The depth of the cam surfaces at the drive face is such as to be less than the height of the drive lugs 124a, b above feedthrough connector face 88 to assure that the lugs remain in contact with the coupler connector and to prevent feedthrough connector face 88 contacting coupler connector face 162. In preferred form, the engagements are angularly displaced by 180° from each other as shown.

With this arrangement, when coupler connector 160 engages spring loaded feedthrough connector 84 and axially displaces it towards rotary seal assembly 58, feedthrough connector lugs 124a, b are biased against engagements 164a, b by compressed spring 104 and are ramped down into electrical and mechanical contact with faces 170a, b by cam surfaces 168a, b as shaft, electrode 82 is rotated. Additionally, by virtue of this arrangement, feedthrough connector 84 is assured of engaging and connecting to coupler 54's connector within one revolution of rotation and of maintaining electrical contact therewith. As will be more fully described hereafter linkage assembly 56 assures that connector 160 axially aligns with connector 84 so that engagements 164a, b are assured of capturing lugs 124a, b. In preferred form, connector 160 is recessed within insulating member 146 and insulating plate 148 is provided at upper face 132 of coupler 54 to limit r.f. coupling of shaft, electrode 152 to housing 130.

Continuing with reference to FIG. 3, lower end 172 of shaft, electrode 152 is seen to include a latch 174 mounted thereto for removably engaging the substrate holder 44. As shown, latch 174 includes a cylindrical body section 176, a base plate 178 and a latch plate 180. As seen in FIG. 3, lower end 172 of shaft, electrode 152 is attached centrally of base plate 178. In preferred form, shaft, electrode end 172 is provided with a thread 182 and a shoulder 184 which fits a centrally located hole 186 in base plate 178. A nut 188 is provided to draw plate 178 against shoulder 186 thereby securing latch 174 to shaft, electrode 152.

As seen in FIGS. 3 and 4, a slot 190 is cut in latch body section 176 just above latch plate 180. As shown, slot 190 extends over approximately 180° of body section 176's circumference. Additionally, plate 180 is provided with a substrate holder positioning slot 192. With this arrangement, the slotted latch body 176 and slotted base plate 180 define a sheath for receiving a latch bayonet 194 which is secured to the substrate holder 44. Bayonet 194 may be secured to holder 44 in any convenient manner are for example with a stud 196 perpendicularly mounted on bayonet 194 to which holder 44 is secured with a thumb nut 198. With this arrangement, stud 196 cooperates with latch plate slot 192 to align holder 44's center line with that of coupler 54 and feedthrough 52. In preferred form, bayonet 194 is provided with a skirt 195 which conforms to slot 190 so that when bayonet 194 is sheathed, latch 174 is smooth lined to avoid points of high electric field intensity when r.f. power is applied. Additionally, and as in the case of feedthrough 52, the elements of coupler 54, except where noted are made of non-magnetic 300 series stainless steel polish etched to a mirror finish to limit points of high electric field intensity when r.f. power is applied. A detent 200 is provided within latch body 176 attached to base plate 178 for retaining bayonet 194 when inserted into the latch sheath as shown in FIG. 3. A lock 202 is provided at the circumference of the latch body 176 to secure bayonet 194 when inserted into the latch bayonet slot.

In addition to feedthrough 52 and coupler 54, mounting and energizing apparatus 50 includes linkage assembly 56. As shown in FIG. 1, linkage assembly 56 includes a mount 206, linkage housing anchor 208, linkage elements 210 and a coupler latch assembly 212. As shown, assembly 56 is fix mounted to bell jar wall 23 within chamber 28 and to coupler 54 such that coupler 54 and holder 44 attached thereto may be located in a first position adjacent to access port 30 and in a second position in alignment with feedthrough 52 at which rotary and electrical energy can be provided to holder 44.

More particularly, mount 206 is provided for locating linkage housing anchor 208, linkage elements 210 and ultimately coupler 54 within chamber 28. Mount 206 is positioned within chamber 28 at the apex of chamber wall 23 (i.e. chamber 28's vertical center line) in alignment with feedthrough shaft, electrode 82 in the direction of housing 22's length. Additionally, mount 206 is located displaced from feedthrough shaft, electrode 82 in the direction of housing 22's length so as to be proximate the access port 30. Mount 206 may take any convenient form as, for example, a pedestal having a base 216 which may be joined to chamber wall 23 as, for example, by welding, a platform 218 for receiving anchor 208 and a spacer 220 for displacing platform 218 and anchor 208 from chamber wall 23 as shown in FIG. 1.

Anchor 208 is provided attached to mount 206 for receiving linkage elements 210. As shown, anchor 208 is in the general shape of a cube corresponding in size to that of coupler housing 130 and has an upper face 222, a lower face 224, a front face 226, a rear face 228, an outside face 230 and an inside face 232. As shown, anchor 208 is joined at upper face 222 to mount platform 218. Anchor front face 224 and rear face 226 are arranged for receiving linkage elements 210. Linkage elements 210, as shown, are in the form of bars having first ends 234 rotationally attached to anchor 208.

In preferred form, four linkage elements 210a, b, c and d are provided which are rotationally fixed in pairs 210a, b and 210c, d at anchor front face 224 and rear face 226 respectively. A second end, 236 of linkage elements 210 are rotationally fixed to coupler body 130. Particularly, linkage elements 210a, b are attached to coupler body front face 136 and elements 210c, d to coupler rear face 138. As best seen in FIG. 1, linkage elements 210 are mounted to anchor 208 and coupler 130 at corresponding points. Particularly, elements 210a, c are connected between the upper inner corners of anchor 208 and coupler body 130 while elements 210b, d are connected between the lower outside corners of anchor 208 and coupler body 130. The consequence of this connection is that coupler body 130 is prevented from rotating when moved between the first position adjacent access port 30 and the second position connected to feedthrough 52. This is done to assure that holder 44 remains horizontal during movement reducing the possibility that substrates mounted on holder 44 will be disturbed or caused to fall.

Rotational attachment of the linkage elements 210 to anchor 208 and coupler body 130 may be accomplished in any convenient manner. In preferred form, linkage elements 210 are provided with holes proximate their ends 234 and 236 dimensioned large enough to rotationally receive shouldered screws 28 best seen in FIG. 3.

With this arrangement, when linkage elements 210 are oriented vertically, a first coupler position is defined in which coupler body 54 is located with its axial center line aligned with the center line of mount 206 and anchor 208. As seen in FIG. 1, this position is proximate chamber access port 30 and facilitates ease of loading holder 44 to coupler 54, i.e. operator waist height.

Further, when linkage elements 210 are oriented horizontally, i.e. coupler rotated 90° about anchor 208, a second coupler position is defined in which coupler 54 is located with its axial center line aligned with feedthrough 52's center line (the tangent to the rotation arc). As will be apparent, the length of the linkage elements 210 are selected so as to assure that in the second position, coupler 54's center line is radially aligned, relative to a reference point at anchor 208, with the center line of feedthrough 52. Thus, the point for the feedthrough center line and coupler center line is established in the direction of the chamber's length as best seen in FIG. 2.

As described, in preferred form, anchor 208 and coupler body 130 are provided in like form and dimension, particularly similarly sized cubes. Additionally, in preferred form, linkage elements 210 are provided in the form of bars fixed to like faces of anchor 208 and coupler body 130. This arrangement has the effect of limiting the movement of coupler 54 to a planar arc when it is transported from its first position to its second position. In effect faces 136, 138 of coupler body 130 and faces 226, 228 of anchor 208 act as reference planes to the linkage element movement. This limitation assures that coupler 54's center line will angularly align, relative to a reference point at 208, with feedthrough 52's center line in the direction of the chamber width as best seen in FIG. 2.

Figure 6:
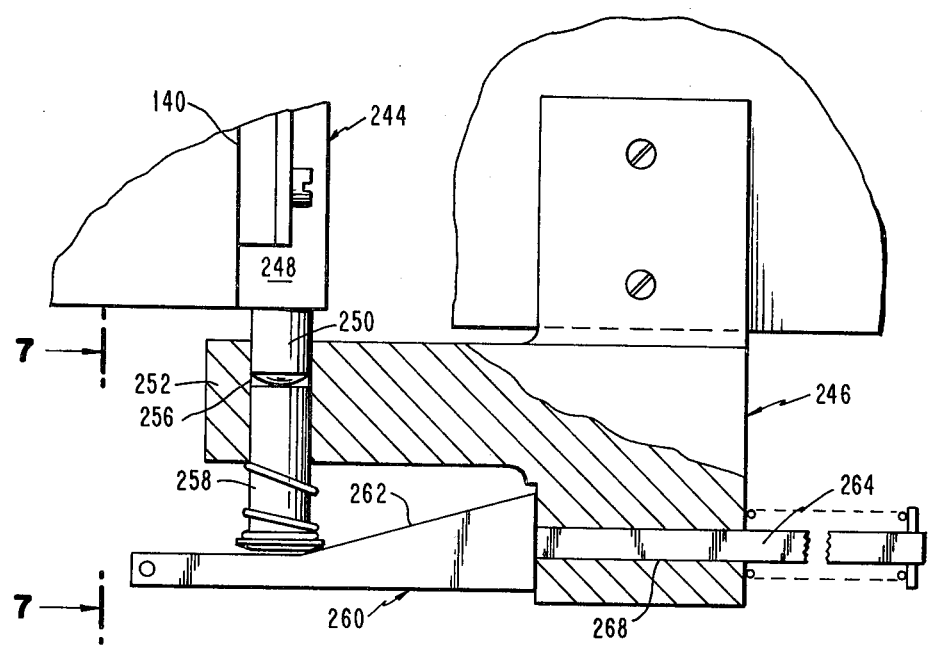
FIG. 6 is a side section view of the coupler latch showing the latch thereof in accordance with this invention.

As noted, linkage apparatus 56 also includes a coupler latch 212. As seen in FIG. 2, coupler latch 212 includes a latch pin assembly 244 fix mounted to inside face 140 of coupler body 130. Additionally, the coupler latch 212 includes a latch plate assembly 246 also seen in FIG. 2. Latch pin assembly 244 and companion latch plate assembly 246 are shown in greater detail in FIGS. 6 and 7. As shown in FIG. 6, latch pin assembly 244 includes a pin housing 248 within which a spring loaded latch pin 250 is mounted. As shown, housing 248 is screw mounted to coupler body face 140 such that latch pin 250 extends beyond coupler body front face 136 and associated linkage elements 210a, b.

Figure 7:
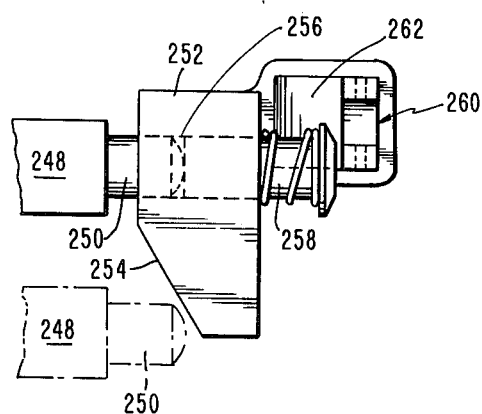
FIG. 7 is a side section view of the coupler latch in accordance with this invention taken along lines 7—7 of FIG. 6.

As shown in FIG. 6, latch plate assembly 246 is mounted to chamber wall 23 such that it is proximate coupler body 130 when the coupler is in its second position aligned with feedthrough 52. As best seen in FIG. 7, latch plate assembly 246 includes a latch plate body 252 having a latch pin cam face 254 and a latch pin receiving bore 256. As seen in FIGS. 6 and 7, a spring loaded release pin 258 is located partially positioned within latch bore 256 and partially outside of latch bore 256. As best seen in FIG. 6, latch plate assembly 246 also includes a spring loaded release lever 260. Lever 260 includes a release cam ramp 262 and a mounting rod 264. Mounting rod 264 as seen is received in latch plate body 252 at locations hole 268.

With this arrangement, when coupler 54 is moved into its second position proximate feedthrough 52, latch pin 250 of latch pin assembly 244 is caused to strike cam surface 254 of body 252 with the result that pin 250 is forced into latch pin housing 248 against its spring load. As pin 250 continues up cam surface 254, it reaches latch bore 256 at which pin 250's spring load causes pin 250 to insert into latch bore 256. Upon entry of pin 250 into latch bore 256, coupler 54 is locked in position.

To release latch pin 250 and with it coupler 54, release cam 262 of release lever 260 is urged against release pin 258 by translating lever 260 against its spring load. As the release cam 256 advances over release pin 258, pin 258 is caused to advance in latch bore 256 displacing latch pin 250. As this action continues, latch pin 250 becomes free of latch bore 256 and coupler 54 is released for movement to its first position.

In operation, mounting and energizing apparatus 50 performs as follows. When a substrate holder 44 is to be loaded within chamber 28, linkage elements 210 of linkage assembly 56 are vertically disposed positioning coupler 54 in its first position proximate the chamber access port 30. In this position, coupler latch bayonet affixed to holder 44 by means of thumb nut 198 is inserted into the latch sheath defined by latch plate 180 and housing 176. When fully inserted, detent 200 secures bayonet 194 within housing 176. Further, lock 178 at latch housing 176's circumference is activated to confine bayonet 194 within the latch. Subsequently, coupler 54 may be manually moved without rotation from its first position to its second position over an arc of 90° for engagement with feedthrough 52. As coupler 54 approaches feedthrough 52, feedthrough connector drive, contact lugs 124 contact face 162 of coupler connector 160. In the case where lugs 124 are not immediately aligned with drive faces 170 of the coupler connector, feedthrough body 184 is caused to be axially displaced along feedthrough shaft electrode 82 thereby compressing feedthrough connector spring 104. As coupler 54 continues movement, coupler latch pin 250 engages latch bore 256 to axially position coupler 54 relative to feedthrough drive shaft, electrode 82. It is to be noted that spacer 220 of linkage mount 206 is diminished in combination with the location of the coupler latch plate assembly 246 such that the relative positioning of feedthrough 52 and coupler 54 is as shown in FIG. 3 when final connection is made. Thereafter, shaft, electrode 82 is rotated to seat lugs 124 of feedthrough connector 84 within engagements 164 of the coupler connector 160. As shaft, electrode 82 is rotated, lugs 124 are urged down over cam surfaces 168 of connector 160 by feedthrough connector spring 104. Within one revolution of shaft, electrode 82, lugs 124 are brought into engagement with drive faces 170. As in the case of feedthrough 52 and coupler 54, the elements of coupler 54, except where noted are made of non-magnetic 300 series stainless steel polish etched to a mirror finish to limit points of high electric field intensity when r.f. power is applied.

While the mounting and energizing apparatus of this invention has been described in a preferred embodiment, it will be appreciated by those skilled in the art that deviations and modifications to the particular details disclosed can be made without departing from the true spirit of the invention.

What we claim is:

1. Apparatus for removably mounting and coupling mechanical and electrical energy to a multiposition holder in a vacuum chamber, the holder for retaining substrates in the chamber during substrate processing, the apparatus comprising:
    a feedthrough mounted on the chamber for transmitting electrical and mechanical energy from outside the chamber to inside the chamber;
    a coupler for releasably engaging the feedthrough and the holder for supplying electrical and mechanical energy from the feedthrough to the holder; and
    a linkage assembly mounted within the chamber and connected to the coupler for locating the coupler in a first position at which the holder may be mounted to the coupler and in a second position at which the coupler may be connected to the feedthrough so that electrical and mechanical energy may be supplied to the holder during processing of the substrates.

2. The apparatus of claim 1 wherein the chamber includes a wall through which the feedthrough passes, the feedthrough being adapted to provide R.F. and D.C. electrical energy and rotational mechanical energy from sources located externally of the chamber to the coupler, located internally of the chamber, the coupler in turn supplying the R.F. and D.C. electrical energy and rotation of mechanical energy to the holder located internally of the chamber.

3. The apparatus of claim 2 wherein the coupler includes a housing having a drive shaft rotationally mounted therein and electrically isolated therefrom, the drive shaft forming an electrode for conducting electrical energy from the feedthrough to the holder, the drive shaft having a connector at a first end for engaging the feedthrough and a latch at the second end for engaging the holder.

4. The apparatus of claim 3 wherein the coupler drive shaft is mounted in a ball bearing assembly, the ball bearing assembly being mounted in an insulating bushing within the coupler housing.

5. The apparatus of claim 3 wherein the feedthrough includes a housing for sealably mounting the feedthrough to the vacuum chamber wall, the feedthrough also including a drive shaft rotatably mounted in the feedthrough housing, for transmitting rotational energy from a source external to the chamber to the coupler within the chamber, the drive shaft also forming an electrode for conducting electrical energy from a source external to the chamber to the coupler within the chamber, the feedthrough drive shaft having a spring loaded connector at a first drive shaft end for resiliently engaging the coupler drive shaft connector.

6. The apparatus of claim 5 wherein the coupler drive shaft connector is provided with a face having ramped engagements for receiving companion drive lugs provided at the feedthrough drive shaft connector, the connectors of the feedthrough and coupler drive shafts, respectively, being arranged such that the drive lugs of the feedthrough connector align with and engage the coupler connector within one revolution of feedthrough drive shaft rotation.

7. The apparatus of claim 6 wherein the chamber includes an access port in the chamber wall to facilitate the introduction and mounting of the holder and substrates in the chamber, and wherein the linkage assembly includes a body fixably mounted to the chamber wall and linkage elements having first ends rotationally mounted to the assembly body and second ends rotationally mounted to the coupler such that the coupler may be moved from a first location proximate the chamber access port to a second location in engagement with the feedthrough.

8. The apparatus of claim 7 wherein the linkage assembly includes a latch for locking the coupler in engagement with the feedthrough.

9. An apparatus for removably mounting and coupling mechanical and electrical energy to a holder in a vacuum chamber, the chamber being defined by a walled chamber housing having a chamber access port therein, the holder for retaining substrates in the chamber during substrate processing, the apparatus comprising:
    a feedthrough sealably mounted through a chamber wall for providing R.F. and D.C. electrical energy and rotational mechanical energy from sources located external to the chamber to within the chamber, the feedthrough including a drive shaft for supplying rotational mechanical energy and being adapted to form an electrode for supplying electrical energy;
    a coupler for releasably engaging the feedthrough and the holder, the coupler including a drive shaft connectable to the feedthrough drive shaft for supplying rotational energy to the holder, the coupler drive shaft adapted to form an electrode for supplying electrical energy to the holder; and
    a linkage assembly mounted to the chamber wall, the assembly including linkage elements connected to the coupler for locating the coupler in a first position adjacent the access port in the chamber housing to permit mounting of the holder to the coupler and for locating the coupler in a second position in which the coupler may engage the feedthrough to supply mechanical and electrical energy to the holder and substrates thereon during processing.

10. The holder of claim 9 wherein the feedthrough and coupler drive shafts are provided with connectors that permit rotational and electrical mating of the drive shafts within one revolution of the feedthrough drive shaft.

11. The apparatus of claim 10 wherein the linkage assembly includes a latch for retaining the coupler drive shaft and feedthrough drive shaft in engagement.

* * * * *